(12) United States Patent
Rinerson et al.

(10) Patent No.: US 7,633,790 B2
(45) Date of Patent: Dec. 15, 2009

(54) MULTI-RESISTIVE STATE MEMORY DEVICE WITH CONDUCTIVE OXIDE ELECTRODES

(75) Inventors: Darrel Rinerson, Cupertino, CA (US); Wayne Kinney, Emmett, ID (US); Edmond Ward, Monte Sereno, CA (US); Steve Kuo-Ren Hsia, San Jose, CA (US); Steven W. Longcor, Mountain View, CA (US); Christophe J. Chevallier, Palo Alto, CA (US); John E. Sanchez, Jr., Palo Alto, CA (US); Philip Swab, Santa Rosa, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 12/286,723

(22) Filed: Oct. 1, 2008

(65) Prior Publication Data

US 2009/0045390 A1 Feb. 19, 2009

Related U.S. Application Data

(60) Continuation of application No. 12/215,958, filed on Jun. 30, 2008, which is a division of application No. 11/473,005, filed on Jun. 22, 2006, now Pat. No. 7,394,679, which is a continuation of application No. 10/773,549, filed on Feb. 6, 2004, now Pat. No. 7,082,052.

(51) Int. Cl.
*G11C 11/00* (2006.01)
(52) U.S. Cl. .................................................. 365/148
(58) Field of Classification Search .................. 365/148
See application file for complete search history.

(56) References Cited

U.S. PATENT DOCUMENTS

2003/0003674 A1* 1/2003 Hsu et al. .................... 438/385

* cited by examiner

*Primary Examiner*—Evan Pert

(57) ABSTRACT

A memory cell including conductive oxide electrodes is disclosed. The memory cell includes a memory element operative to store data as a plurality of resistive states. The memory element includes a layer of a conductive metal oxide (CMO) (e.g., a perovskite) in contact with an electrode that may comprise one or more layers of material. At least one of those layers of material can be a conductive oxide (e.g., a perovskite such as $LaSrCoO_3$—LSCoO or $LaNiO_3$—LNO) that is in contact with the CMO. The conductive oxide layer can be selected as a seed layer operative to provide a good lattice match with and/or a lower crystallization temperature for the CMO. The conductive oxide layer may also be in contact with a metal layer (e.g., Pt). The memory cell additionally exhibits non-linear IV characteristics, which can be favorable in certain arrays, such as non-volatile two-terminal cross-point memory arrays.

8 Claims, 7 Drawing Sheets

MULTI-RESISTIVE STATE MEMORY DEVICE WITH CONDUCTIVE OXIDE ELECTRODES

BACKGROUND OF THE INVENTION

1. Field of the Invention

The present invention relates generally to computer memory, and more specifically to memory fabrication.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be delivered through two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in the U.S. Pat. No. 6,204,139 patent are not generally applicable to RAM memory because the resistance of the material, when scaled to small dimensions, is considered to be too large to make a memory with fast access times.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, September 2001, all of which are hereby incorporated by reference for all purposes.

The discovery of the resistance-changing property of certain CMOs, however, is relatively recent and has not yet been implemented in a commercial memory product. There are continuing efforts to bring a true non-volatile RAM (nvRAM) to market.

SUMMARY OF THE INVENTION

The present invention generally provides a multi-resistive state element that is created by treating a conductive element. One embodiment is a memory array that includes a plurality of two-terminal memory plugs. Each two-terminal memory plug is operable to change from a high resistive state to a low resistive state upon application of a first write voltage and change from a low resistive state to a high resistive state upon application of a second write voltage. Furthermore, each two terminal memory plug includes a multi-resistive state element that has a conductive element and a reactive metal that reacts with the conductive element.

In yet another embodiment of the invention, the multi-resistive state element has a conductive element and a very thin layer of material that is less than 200 Å thick deposited on the conductive element.

In some embodiments of the invention, the conductive element is a conductive metal oxide and either the reactive metal or the very thin layer of material is Al, Ti, Mg, W, Fe, Cr, V, Zn, Ta or Mo. In other embodiments of the invention, the memory plug includes a top electrode and a bottom electrode. In yet other embodiments of the invention, the top electrode is Pt.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the FIGS. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

The Memory Array

Conventional nonvolatile memory requires three terminal MOSFET-based devices. The layout of such devices is not ideal, usually requiring an area of at least 8 $f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of 4 $f^2$ can be utilized. U.S. patent application, "Cross Point Memory Array Using Multiple Thin Films," U.S. application Ser. No. 10/330,512, filed Dec. 26, 2002, now issued U.S. Pat. No. 6,753,561, incorporated herein by reference in its entirety and for all purposes, describes such a device.

Figure 1A:
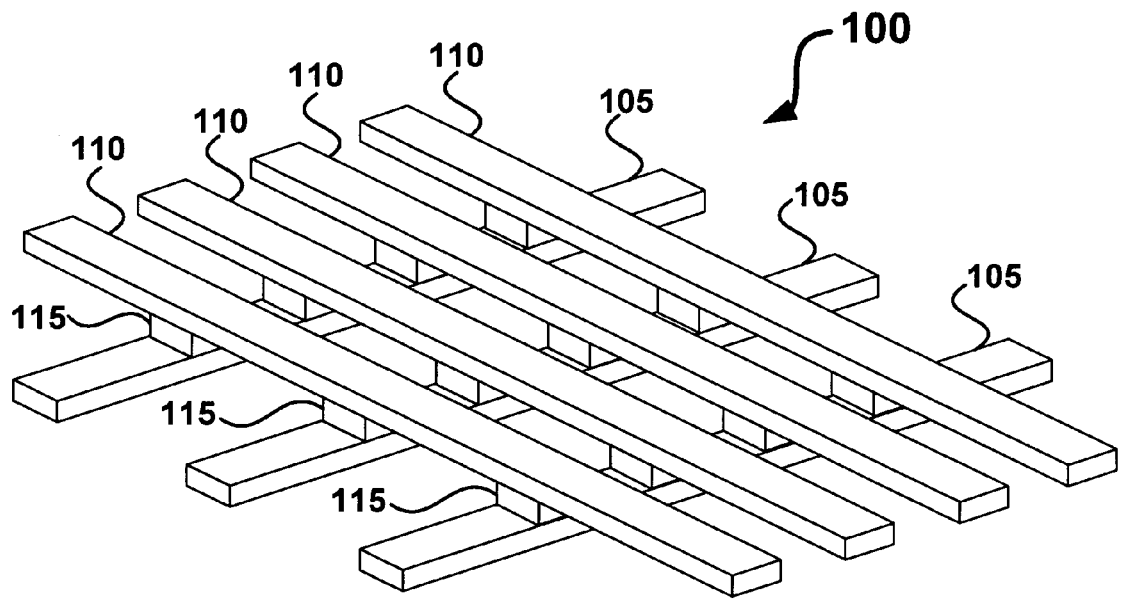
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Conductive array line layers 105 and 110 can generally be constructed of any conductive material, such as aluminum, copper, tungsten or certain ceramics. Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2A:
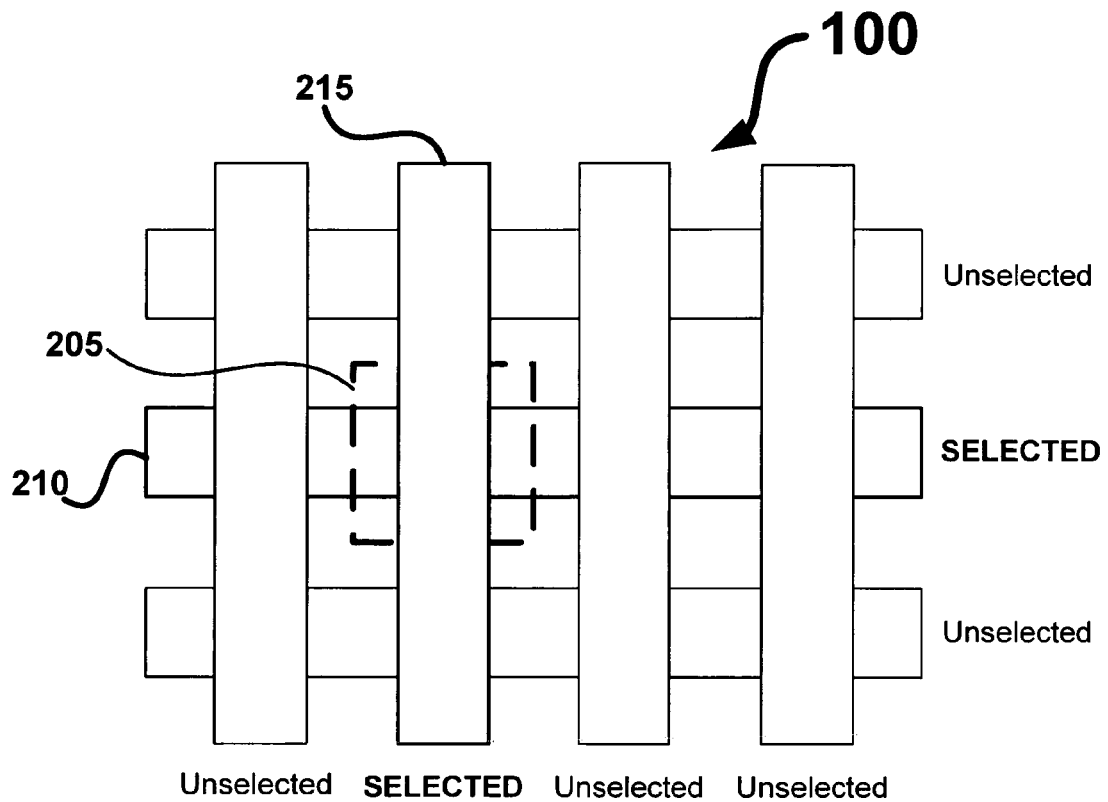
FIG. 2A depicts a plan view of selection of a memory cell in the cross point array depicted in FIG. 1A.
Figure 2B:
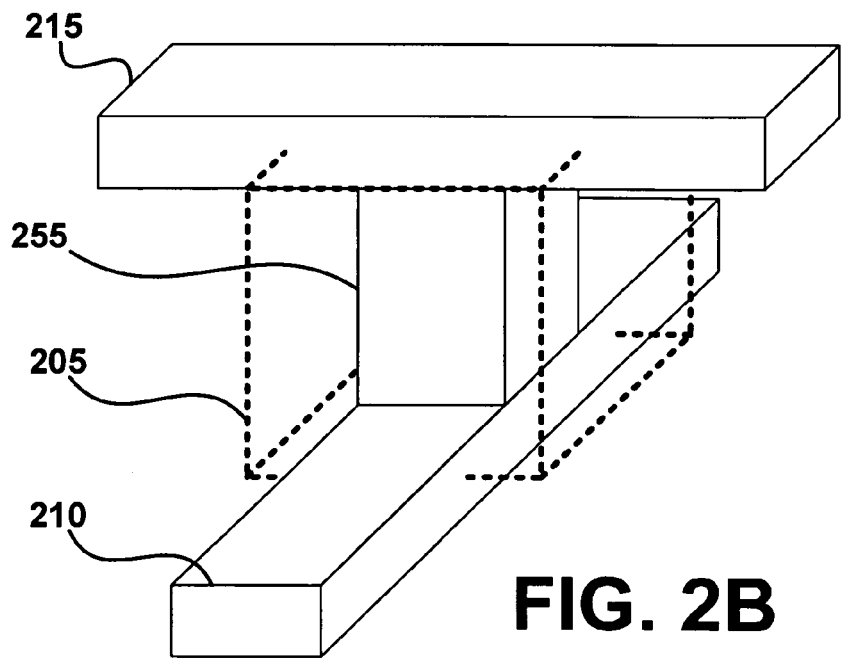
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 1B:
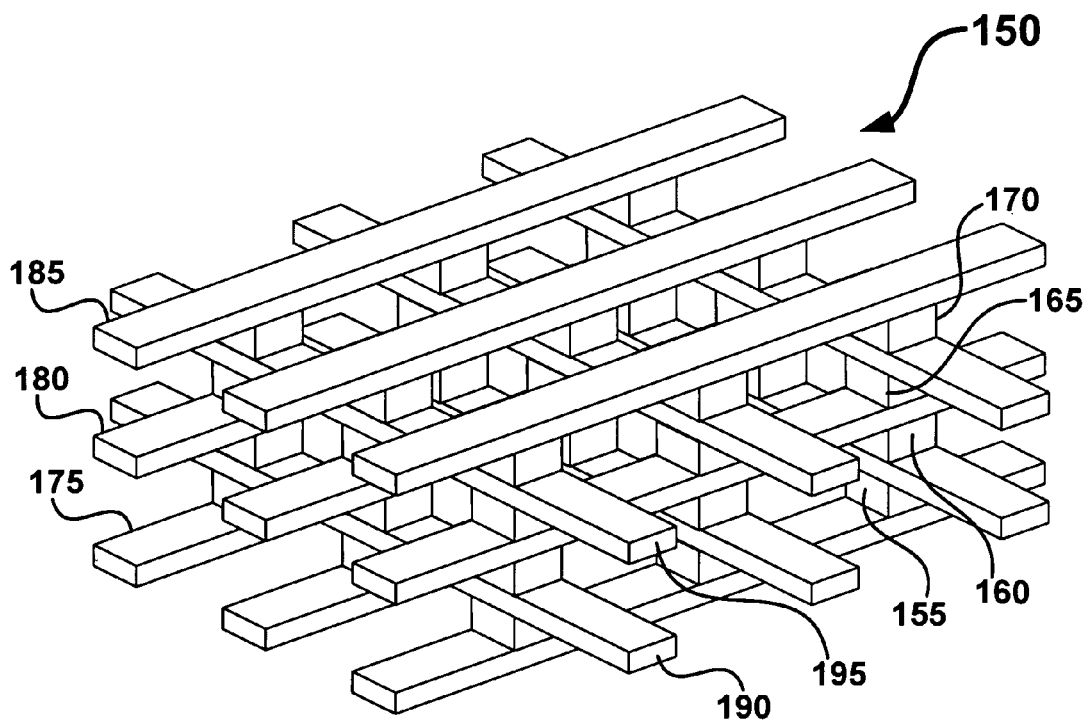
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170. U.S. patent application, "Re-Writable Memory With Multiple Memory Layers," U.S. application Ser. No. 10/612,191, filed Jul. 1, 2003, now issued U.S. Pat. No. 6,906,939, incorporated herein by reference in its entirety for all purposes, describes stacked cross point arrays.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

Figure 6A:
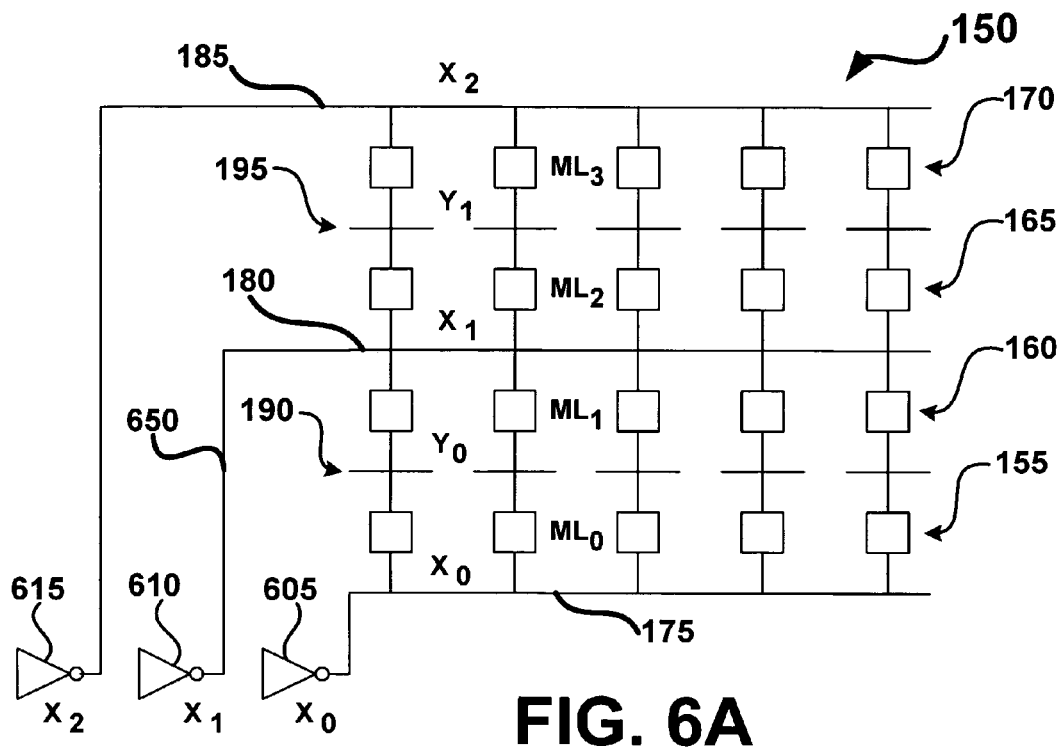
FIG. 6A depicts a schematic diagram of x-direction driver sets.
Figure 6B:
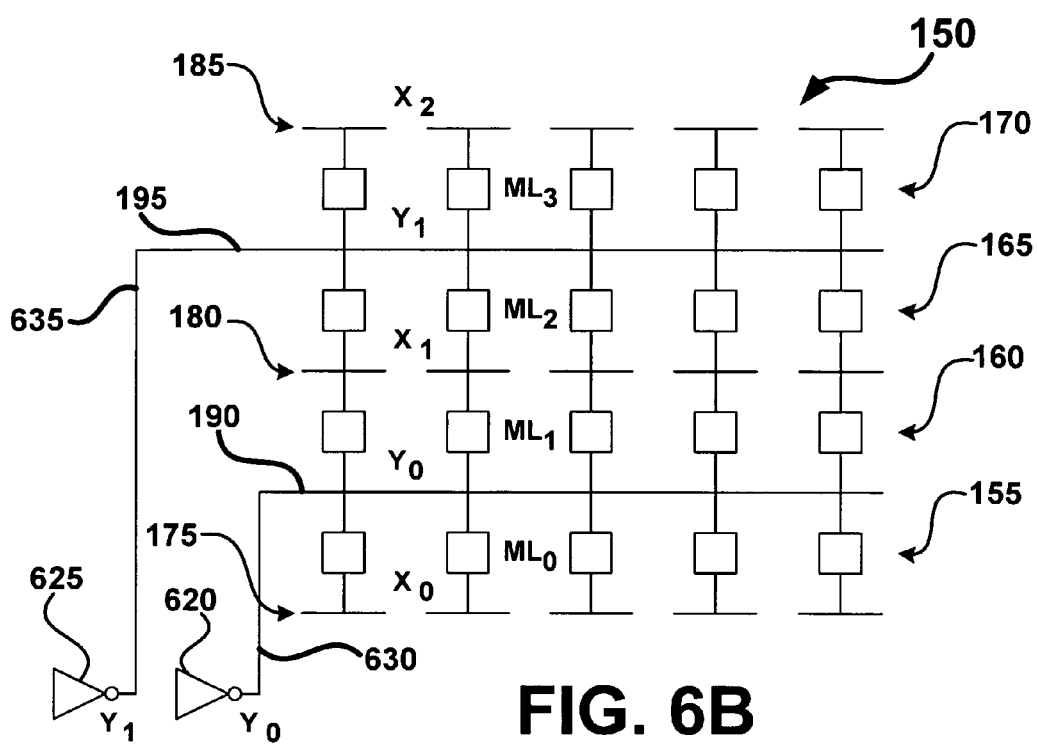
FIG. 6B depicts a schematic diagram of y-direction driver sets.

One benefit of the cross point array is that the active circuitry that drives the cross point array 100 or 150 can be placed beneath the cross point array, therefore reducing the footprint required on a semiconductor substrate. U.S. patent application, "Layout Of Driver Sets In A Cross Point Memory Array," U.S. application Ser. No. 10/612,733, filed Jul. 1, 2003, now issued U.S. Pat. No. 7,079,442, incorporated herein by reference in its entirety for all purposes, describes various circuitry that can achieve a small footprint underneath both a single layer cross point array 100 and a stacked cross point array 150. Further details of the peripheral circuitry are described in U.S. patent application, "An Adaptive Programming Technique for a Re-Writeable Conductive Memory Device," U.S. application Ser. No. 10/680,508, filed Oct. 6, 2003, now issued U.S. Pat. No. 6,940,744, incorporated herein by reference in its entirety for all purposes. FIG. 6A depicts x-direction driver sets 605, 610, and 615 that are used to select specific x-direction conductive array lines in a $X_0$ layer 175, $X_1$ layer 180, and $X_2$ layer 185. Although the $X_0$ driver 605 and the $X_2$ driver 615 can use identical logic, separate drivers are shown because of the difficulty in routing the single $X_0$ driver 605 around a thru 650 that connects the $X_1$ layer 180 to the $X_1$ driver 610. FIG. 6B depicts y-direction driver sets 620 and 625 that are used to select specific y-direction conductive array lines in the y-direction conductive array line layers 190 and 195. The $Y_0$ driver set 620 uses a thru 630 that goes through one ILD layer in order to connect with the $Y_0$ layer 190. The $Y_1$ driver set 625 uses a thru 635 that goes through three ILD layers in order to connect with the $Y_1$ layer 195.

The cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
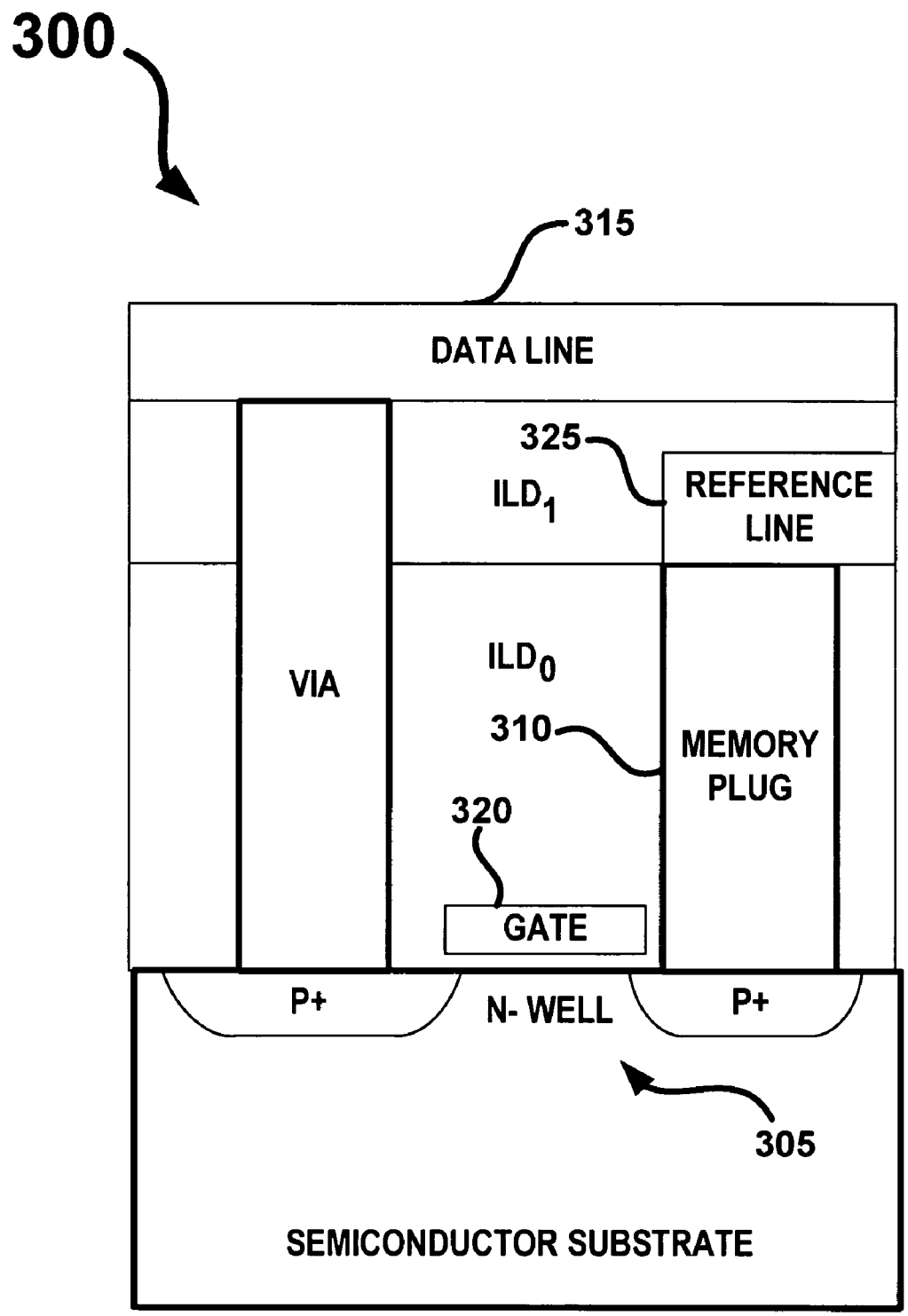
FIG. 3 depicts a generalized representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other. U.S. patent application, "Non-Volatile Memory with a Single Transistor and Resistive Memory Element," U.S. application Ser. No. 10/249,848, filed May 12, 2003, now issued U.S. Pat. No. 6,856,536, incorporated herein by reference in its entirety for all purposes, describes the specific details of designing and fabricating a transistor memory array.

The Memory Plug

Each memory plug 255 or 310 contains a multi-resistive state element (described later) along with any other materials that may be desirable for fabrication or functionality. For example, the additional materials might include a non-ohmic device, as is described in application "High Density NVRAM," U.S. application Ser. No. 10/360,005, filed Feb. 7, 2003, now issued U.S. Pat. No. 6,917,539, incorporated herein by reference in its entirety for all purposes. The non-ohmic device exhibits a very high resistance regime for a certain range of voltages ($V_{NO-}$ to $V_{NO+}$) and a very low resistance regime for voltages above and below that range. The non-ohmic device, either alone or in combination with other elements, may cause the memory plug 255 or 310 to exhibit a non-linear resistive characteristic. Exemplary non-ohmic devices include three-film metal-insulator-metal (MIM) structures and back-to-back diodes in series.

Furthermore, as described in "Rewriteable Memory With Non-Linear Memory Element," U.S. application Ser. No. 10/604,556, filed Jul. 30, 2003, now issued U.S. Pat. No. 6,870,755, incorporated herein by reference in its entirety for all purposes, it may also be possible for the memory cell exhibit non-linear characteristics without a separate non-ohmic device. It should be noted that since it is possible for a memory cell to exhibit non-linear characteristics the terms "resistive memory" and "resistive device" also apply to memories and devices showing non-linear characteristics, and can also be referred to as "conductive memory" and "conductive device." While a non-ohmic device might be desirable in certain arrays, it may not be helpful in other arrays. Regardless, if certain treatments are used to improve the switching characteristics of the memory plug the treatments may also create an integrated non-ohmic device. Such a non-ohmic device may, therefore, be used even if it is not necessary in that type of array.

Electrodes will typically be desirable components of the memory plugs 255 or 310, a pair of electrodes sandwiching the multi-resistive state element. If the only purpose of the electrodes is as a barrier to prevent metal inter-diffusion, then a thin layer of metal, e.g. TiN, Pt, Au, Ag and Al could be used. However, conductive oxide electrodes may provide advantages beyond simply acting as a metal inter-diffusion barrier. U.S. patent application, "Conductive Memory Device With Barrier Electrodes," U.S. application Ser. No. 10/682,277, filed Oct. 8, 2003, now issued U.S. Pat. No. 7,067,862, incorporated herein by reference in its entirety for all purposes, describes electrodes (formed either with a single layer or multiple layers) that prevent the diffusion of metals, oxygen, hydrogen and water, act as a seed layer in order to form a good lattice match with the conductive memory element, include adhesion layers, and reduce stress caused by uneven coefficients of thermal expansion, and provide other benefits. Additionally, the choice of electrode layers in combination with the multi-resistive state element layer may affect the properties of the memory plug 255 or 310, as is described in U.S. patent application, "Resistive Memory Device With A Treated Interface," U.S. application Ser. No. 10/665,882, filed Sep. 19, 2003, now issued U.S. Pat. No. 7,326,979, incorporated herein by reference in its entirety for all purposes.

Figure 7:
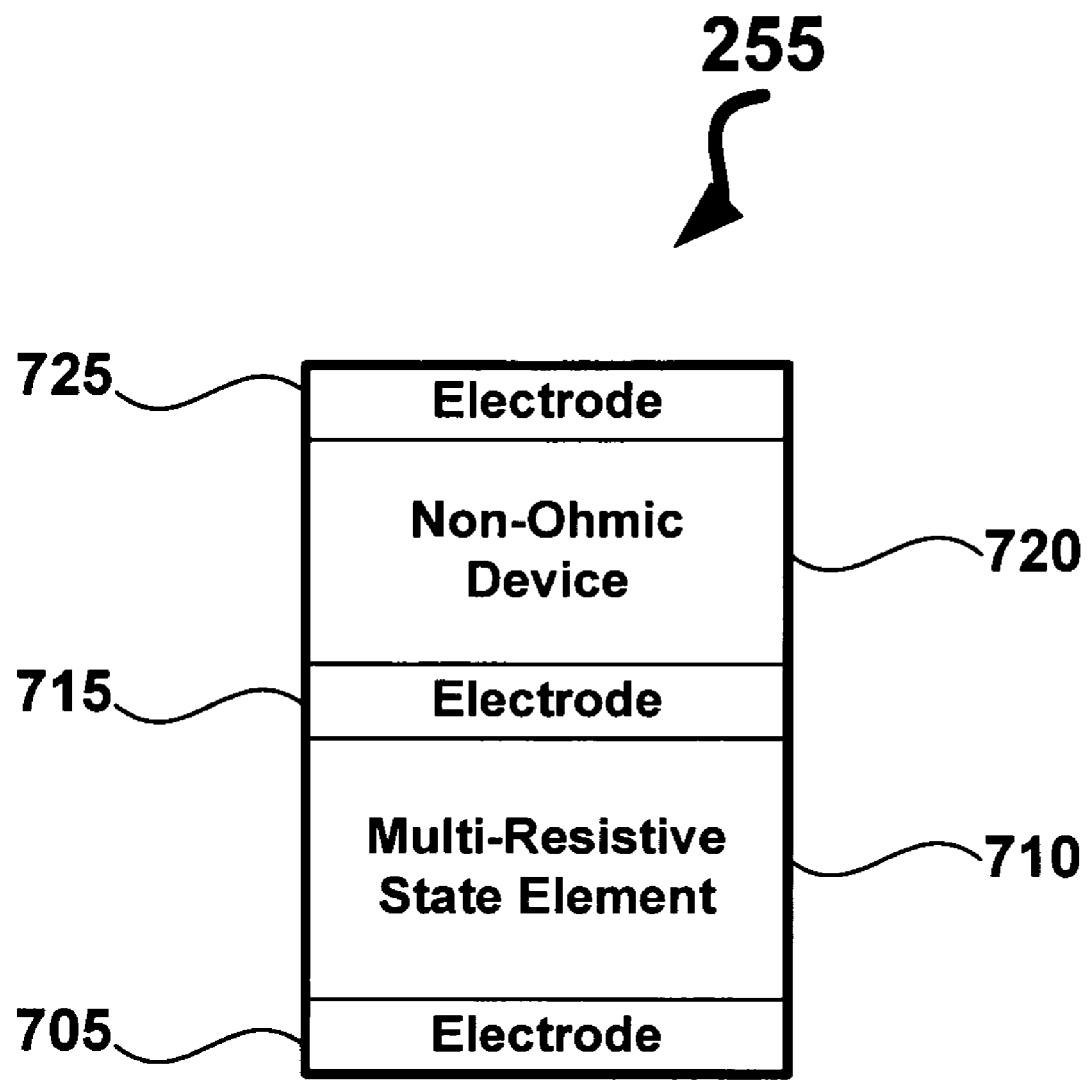
FIG. 7 depicts an elevation view of an exemplary memory plug with five layers.

Typical electrodes 705, 715 and 725 (see FIG. 7) commonly used in fabrication include Pt, Au, Ag and Al. If the only purpose of the electrodes 705, 715 and 725 is as a barrier to prevent metal inter-diffusion, then a thin layer of metal, e.g. TiN, could be used. However, conductive oxide electrodes may provide advantages beyond simply acting as a metal inter-diffusion barrier.

For example, a conducting oxide electrode might modify the formation and migration of oxygen vacancies in the memory material. Oxygen vacancies can cause degradation of electrical properties in the multi-resistive state element 710 (see FIG. 7). A conducting oxide electrode can also withstand high temperature processing. Most metals either start oxidizing or combining with adjacent materials at temperatures above 400° C. Accordingly, fabrication processes above these temperatures can be considered to be high temperature processing. Additionally, conducting oxide electrodes will not degrade during operation. Regular metal electrodes may degrade due to the electric field and interaction between the metal atoms and the memory material atoms.

Examples of conductive oxides include $LaSrCoO_3$, $RuO_2$, $IrO_2$, $SrRuO_3$, $LaNiO_3$ and doped strontium titanate (STO). The dopant used in STO can be either Nb or Ta to substitute for titanium atoms, or any rare earth such as La or Pr to substitute for strontium atoms. Generally, a conducting oxide electrode is metallic with resistivity below 1 Ω-cm.

Conducting oxide electrodes can be fabricated directly, or can be made with a material that is not initially an oxide, but is subsequently oxidized during further processing or operation. Ru and Ir are both examples of materials that can be oxidized during processing or operation.

Additionally, certain materials oxidize at a finite rate and allow dual layers to form. For example, Ir might be particularly well suited for making contact to an underlying conductive array line layer 105. When Ir is oxidized, the top of the Ir layer becomes $IrO_2$. Since the $IrO_2$ grows at a finite rate it becomes possible to control the oxidation so that a dual layer of $Ir/IrO_2$ is formed. Such a dual layer could provide a good contact on the un-oxidized bottom while still forming an oxygen barrier on the oxidized top.

Furthermore, some conductive oxides electrodes form a good lattice match with the multi-resistive state element 710, and thus lower crystallization temperature for the resistive material. For example, if the multi-resistive state element 710 is STO, possible conductive oxide electrodes that make a good lattice match include doped STO, $LaSrCoO_3$, and $SrRuO_3$. If the multi-resistive state element 710 is PCMO, possible conductive oxide electrodes include the STO electrodes and also $LaNIO_3$. A seed layer will often be used on top of the thin layer of metal. A seed layer will help the formation of the layer grown or deposited above it. For example, the seed layer could be on Pt, Ru, Ir or TIN. Some seed layer/metal layer matches include $LaNiO_3$ or $SrRuO_3$ on Pt, $IrO_2$ on Ir, $RuO_2$ on Ru, and Pt on TiN.

Another benefit to certain conductive oxide electrodes is that stress may be reduced by more closely matching the conductive oxide electrode's coefficient of thermal expansion to the multi-resistive state element 710.

The electrodes 705, 715 and 725 might be further improved by using a layer of metal such as platinum between the multi-resistive state element layer 710 and the conductive oxide electrode. Such implementations advantageously provide a good barrier with the conductive oxide, and a good contact with an adjacent metal layer.

Barrier layers are generally helpful to prevent inter-diffusion of atoms after different materials have been deposited. For example, barrier layers can block the diffusion of metals, oxygen, hydrogen or water. Binary oxides or nitrides with 2 elements and ternary oxides or nitrides with 3 elements are particularly suited to high temperature processing. Unlike a regular electrode like titanium that oxidizes and becomes non-conductive, titanium nitride will not oxidize and will remain conductive until about 500° C. Ternary oxides oxidize at even higher temperatures, typically about 50° C. higher than binary oxides. The rate of oxidation depends on the temperature and the oxygen partial pressure.

Examples of binary nitrides include titanium nitride, tantalum nitride and tungsten nitride. Examples of ternary nitrides include titanium silicon nitride, tantalum aluminum nitride, tantalum silicon nitride, and ruthenium titanium nitride. An example of a ternary oxide is ruthenium tantalum oxide.

As will be appreciated by those skilled in the art, an electrode may require other layers, in order to properly function. For example adhesion layers are sometimes necessary. An adhesion layer is used between a substrate and thin-film layer to improve adhesion of the thin-film layer to substrate. Pt does not stick well to $SiO_2$, so a glue layer, such as Ti or $TiO_2$, is used between them for better adhesion. Similarly, a sacrificial barrier layer is an oxide layer that is deposited for the sole purpose of capturing all the oxygen that could otherwise diffuse into other layers, such as the multi-resistive state element 710. The electrode 705 is considered to consist of everything in between x-direction conductive array line 210 and the multi-resistive state element 710, including any adhesion or sacrificial barrier layers, as required. Similarly, the electrode 715 consists of all layers between the multi-resistive state element 710 and the non-ohmic device 720 and the electrode 725 consists of everything in between the non-ohmic device 720 and the y-direction conductive array line 215.

For example, an electrode may includes a TiN or TiAlN layer, an Ir layer and an $IrO_2$ layer to have good metal barrier and oxygen barrier properties. However, such additional layers are only necessary to the extent they are required. Certain conductive oxide electrodes may provide multiple functions. For example, ternary nitrides and ternary oxides that have one component that is either ruthenium or iridium and another component that is either tantalum or titanium can act as both a barrier layer and a sacrificial high-temperature oxygen barrier.

It will be appreciated that the choice of electrode layers 705, 715 and 725 in combination with the multi-resistive state element layer 710 may affect the properties of the memory plug 255 or 310.

The multi-resistive state element will generally (but not necessarily) be crystalline—either as a single crystalline structure or a polycrystalline structure. One class of multi-resistive state element are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr), other materials such as $Ca_2Nb_2O_7$:Cr, and $Ta_2O_5$:Cr, and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state element for use in the memory plug 255 or 310. The compounds that make up the perovskite class of multi-resistive state elements include both simple conductive metal oxides and complex conductive metal oxides. Further, some oxides that may not be conductive in their pure form may be used as they become conductive through the addition of dopants, or if they are used as a very thin layer (e.g., in the order of tens of Angstroms) in which case tunneling conduction can be achieved. Therefore, as will be appreciated by those skilled in the art, the terms "conductive memory," "conductive element," and "conductive device" can include devices that are fabricated with materials that are classified as insulators, but are thin enough to allow tunneling conduction.

Multi-resistive state elements, however, are not limited to perovskites. Specifically, any conductive element (composed of either a single material or a combination of materials) that has a hysteresis that exhibits a resistive state change upon application of a voltage while allowing non-destructive reads is a good candidate for a multi-resistive state element. A non-destructive read means that the read operation has no effect on the resistive state of the memory element. Measuring the resistance of a memory cell is accomplished by detecting either current after the memory cell is held to a known voltage, or voltage after a known current flows through the memory cell. Therefore, a multi-resistive state element that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. The same principle applies if more that one resistive state is used to store information (e.g., the multi-resistive state element has a high resistive state of $R_{00}$, a medium-high resistive state of $R_{01}$, a medium-low resistive state of $R_{10}$ and a low resistive state of $R_{11}$).

As described in U.S. patent application, "A 2-Terminal Trapped Charge Memory device with Voltage Switchable Multi-Level Resistance," U.S. application Ser. No. 10/634,636, filed Aug. 4, 2003, now issued U.S. Pat. No. 7,038,935, incorporated herein by reference in its entirety for all purposes, trapped charges are one mechanism by which the hysteresis effect is created. Trapped charges can be encouraged with dopants, as described in U.S. patent application, "Multi-Resistive State Material that Uses Dopants," U.S. application Ser. No. 10/604,606, filed Aug. 4, 2003, now issued U.S. Pat. No. 7,071,008, incorporated herein by reference in its entirety for all purposes.

Treating The Conductive Element

Properties of the multi-resistive state elements can be further enhanced, or even created, with certain treatments. For example, a reactive metal, such as Al, Ti, Mg, W, Fe, Cr, V, Zn, Ta or Mo can create a differential between the high resistive state and the low resistive state in a conductive metal oxide that does not exhibit switching properties in an untreated condition. Similarly, a reactive metal can enhance the switching properties of a conductive element that already exhibits switching properties. The reactive metal reacts with the conductive element and forms a layer of reacted metal, therefore creating a multi-resistive state element with enhanced properties. Furthermore, following the deposition of the reactive metal with an anneal (e.g., 400° C. in an argon or similarly non-reactive environment) can give the memory plug a more stable structure.

The reactive metal can additionally create a non-ohmic device within the multi-resistive state element. Typically, the thicker the layer of reacted metal is, the greater the range of voltages $V_{NO-}$ to $V_{NO+}$. However, there is a limit to how much reactive metal can diffuse and react with the conductive element.

For example, if 500 Å of Al were used on a PCMO perovskite, only the first 100 Å may fully react with the underlying conductive element. The unreacted portion of the reactive metal might then cause the memory plug to have degraded properties. Furthermore, the best switching properties may not coincide with the largest range of voltages $V_{NO-}$ to $V_{NO+}$. Although most applications would use between 10 Å and 100 Å of reactive metal, between 25 Å and 50 Å would typically be preferred in most conditions. Those skilled in the art will appreciate that such reactive metal layers would be considered "very thin" layers. Very thin layers typically describe any layer that is less than 200 Å.

Figure 5B:
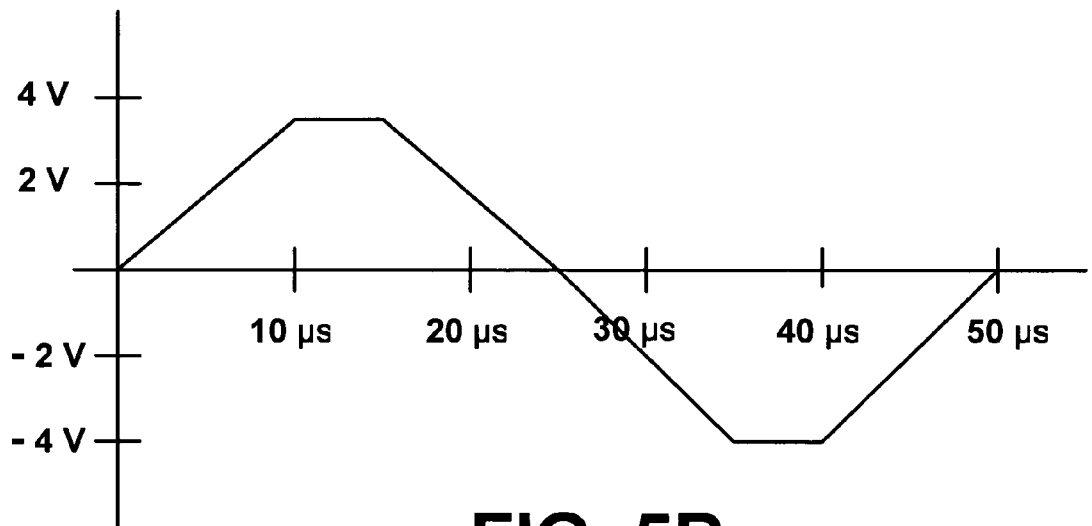
FIG. 5B is a chart depicting the double ramp voltage pulse used to for the measurements of FIG. 5A.
Figure 5A:
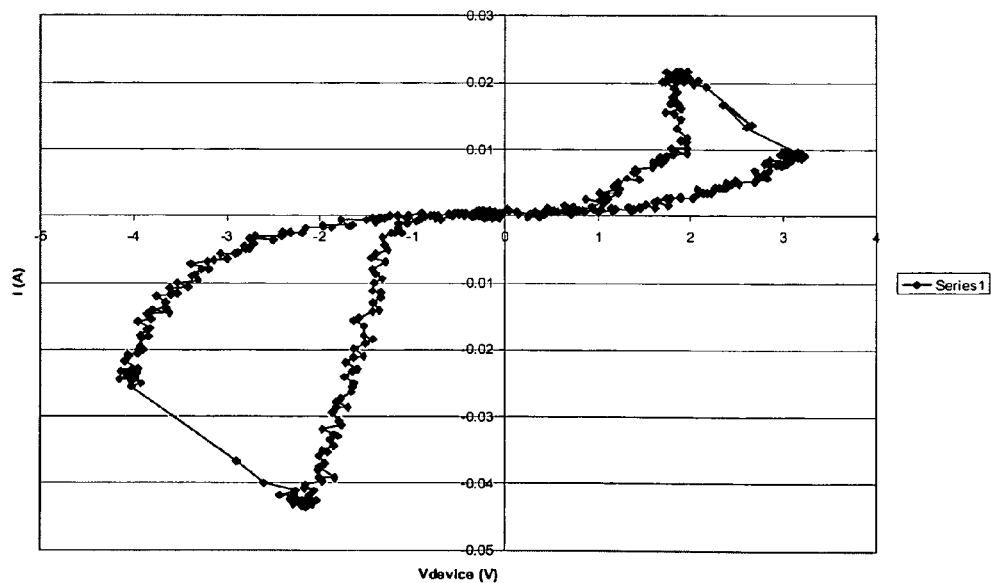
FIG. 5A is a chart of measurements across a multi-resistive state memory element after a layer of reactive metal has been deposited.

By monitoring current through a resistance set in series with the multi-resistive state element, and graphing this current versus an applied pulse shaped as a double ramp, an I-V curve can be obtained which shows the switching of the memory element in real time. This contrasts with standard IV curves, which are taken with a very slow ramp, in the order of tens of millisecond, and only represent the DC functionality of the memory element. FIG. 5A is a chart of measurements across a multi-resistive state memory element after a layer of reactive metal has been deposited, using a pulse with a 10 µs positive ramp, 5 µs high or low level at +3.5 and −4V, and a 10 µs negative ramp, as shown in FIG. 5B.

Fabrication

Figure 4:
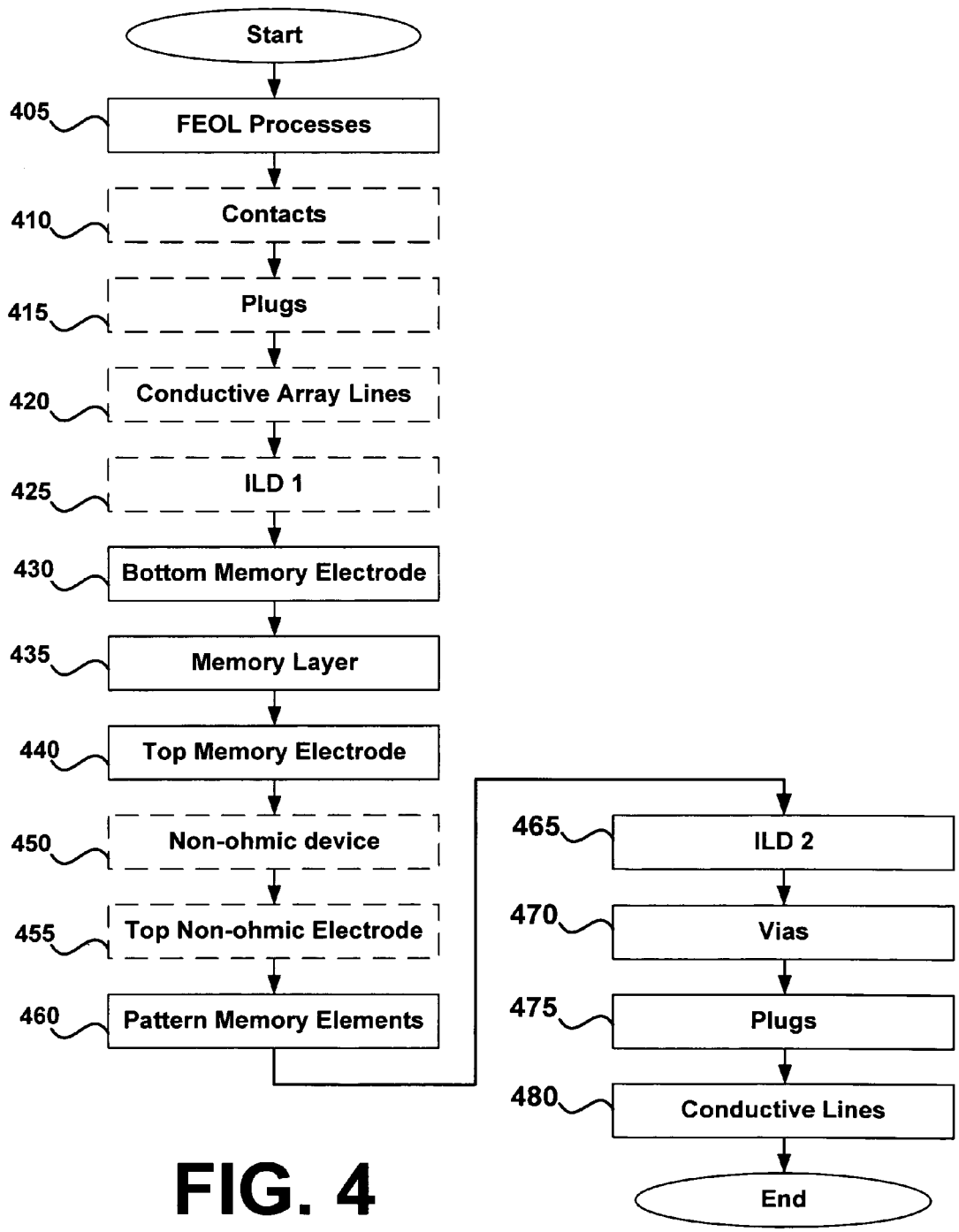
FIG. 4 depicts an exemplary flow chart of various processing steps that could be involved in fabrication of a memory.

FIG. 4 is an exemplary flow chart of various processing steps that could be involved in fabrication of a memory. At 405, standard front end of line (FEOL) processes can be used to form the active circuitry that drives the cross point memory array. FEOL processes are generally defined as operations performed on a semiconductor wafer in the course of device manufacturing up to first metallization, and might end with chemical-mechanical polishing (CMP) of an inter-layer dielectric (ILD). Certain cross point arrays, especially those with active circuitry underneath the memory array, might also include various metallization layers in step 405. The metallization layers are used to electrically connect the active circuitry to the conductive array lines of the cross point array 100 or 150.

The next processing step at 410 is formation of contact holes through the ILD to appropriate positions in the active circuitry (or metallization layers in the case of some cross point arrays) followed by plug formation at 415. Certain transistor memory arrays may require these steps if, for example, the memory plug 310 were so wide that it would overlap the transistor's gate 320. Otherwise, the memory plug 310 could be formed directly on top of the semiconductor substrate 305.

Once the plugs are formed, a cross point array 100 or 150 would require that the conductive array lines be patterned on the wafer at 420. If refractory metals with relatively high resistivities are used for the conductive array lines, the maximum length and minimum cross-sectional area may be limited in comparison to aluminum or copper.

Another ILD layer could be deposited over the first layer of conductive array lines at 425. The dielectric layer can be deposited over the conductive array lines by plasma-enhanced chemical vapor deposition (PECVD) and then planarized by CMP to expose the top surfaces of the conductive array lines.

At 430 the memory plug formation begins. In the case of transistor memory array, the memory plug can be formed directly on the contact hole plugs. In the case of a cross point array, the memory plugs are formed on the bottom conductive array lines.

Regardless of the memory array, a memory plug generally begins with the deposition of the bottom electrodes at 430. At 435 the multi-resistive state elements are deposited, typically using high temperature processing (e.g., solution based spin on followed by high temperature anneal, pulsed laser deposition, sputtering, and metal-organic chemical vapor deposition). However, U.S. patent applications, "Laser Annealing of Complex Metal Oxides (CMO) Memory Materials for Non-Volatile Memory Integrated Circuits," U.S. application Ser. No. 10/387,799, now issued U.S. Pat. No. 7,309,616, and "Low Temperature Deposition of Complex Metal Oxides (CMO) Memory Materials for Non-Volatile Memory Integrated Circuits," U.S. application Ser. No. 10/387,773, now issued U.S. Pat. No. 7,063,984, both filed Mar. 13, 2003, and both incorporated herein by reference in their entireties for all purposes, describe fabrication techniques that may be able to be used in lieu of high temperature fabrication processes. If high temperature fabrication were used, then all the circuitry elements that were deposited before the multi-resistive state element would need to withstand those high temperatures. Using refractory metals are one technique that can be used to create elements that can endure high temperatures.

It should also be appreciated that fabrication of the multi-resistive state element might include additional techniques in order to ensure an effective memory device. For example, biasing the multi-resistive state element might be beneficial in order to ensure the hysteresis is presented in a certain direction. U.S. patent application, "Multi-Layer Conductive Memory Device," U.S. application Ser. No. 10/605,757, filed Oct. 23, 2003, now issued U.S. Pat. No. 6,965,137, incorporated herein by reference in its entirety for all purposes describes using a multi-layered multi-resistive state element in order to encourage a hysteresis in a certain direction. As previously discussed, a reactive metal can also be a desirable addition to the multi-resistive state element.

At 440 another electrode is deposited on top of the multi-resistive state element. At 450 the optional non-ohmic device is formed. If the non-ohmic device is a MIM structure, a top electrode layer may or may not be necessary at 455. In addition, this top electrode layer could include a barrier layer to prevent metal inter-diffusion.

At 460 standard photolithography and appropriate multi-step etch processes could be used to pattern the memory/non-ohmic film stack into memory cell plugs. U.S. patent application, "Conductive Memory Stack With Non-Uniform Width," U.S. application Ser. No. 10/605,963, now issued U.S. Pat. No. 7,009,235, filed Nov. 10, 2003, incorporated herein by reference in its entirety for all purposes describes an improved fabrication technique that includes etching a memory plug with a non-uniform width and using a sidewall layer around the memory plug.

At 465 depositing another ILD, which can then be planarized by CMP, fills in the spaces between the plugs. At 470 via holes are formed in the ILD. Via holes could be formed to connect the tops of the memory cell islands and are one mechanism that can be used to provide connections between metal interconnect layers. The via holes are then filled at 475.

The top layer(s) of conductive array lines could then be formed at 480. If there are no more memory elements to form at high temperature, the final layer(s) of conductive array lines may comprise aluminum, copper or other high conductivity metal.

CONCLUDING REMARKS

Although the invention has been described in its presently contemplated best mode, it is clear that it is susceptible to numerous modifications, modes of operation and embodiments, all within the ability and skill of those familiar with the art and without exercise of further inventive activity. For example, instead of limiting how much reactive metal is deposited on top of the multi-resistive state element, any excess unreacted material can simply be polished off with CMP. Accordingly, that which is intended to be protected by Letters Patent is set forth in the claims and includes all variations and modifications that fall within the spirit and scope of the claim.

What is claimed is:

1. A memory cell, comprising:
 a memory element including at least one lever of material, the at least one layer of material including a lever of conductive metal oxide (CMO) operative to store data as a plurality of resistive states; and a first electrode in contact with the CMO and including at least one layer of an electrically conductive material, the at least one layer of the electrically conductive material is in direct contact with the CMO and Includes a perovskite conductive oxide layer comprised of lanthanum strontium cobalt oxide.

2. A memory cell, comprising:

a memory element including at least one layer of material, the at least one layer of material including a layer of conductive metal oxide (CMO) operative to store data as a plurality of resistive states, the CMO comprises a first perovskite material; and a first electrode in contact with the CMO and including at least one layer of an electrically conductive material that includes a conductive oxide layer in direct contact with the CMO, the conductive oxide layer comprises a second perovskite material that is different than the first perovskite material, wherein the first perovskite material and the second perovskite material are crystalline and have substantially matching lattice structures and the second perovskite material comprises lanthanum strontium cobalt oxide.

3. A memory cell, comprising:

a memory element including at least one layer of material, the at least one layer of material including a layer of conductive metal oxide (CMO) operative to store data as a plurality of resistive states; and a first electrode in contact with the CMO and including at least one layer of an electrically conductive material, the at least one layer of the electrically conductive material including a conductive oxide layer in direct contact with the CMO and a layer of metal that is not in contact with the CMO.

4. The memory cell of claim 3, wherein the layer of metal is in contact with the conductive oxide layer.

5. The memory cell of claim 4, wherein the layer of metal comprises platinum.

6. A memory cell, comprising:

a memory element including at least one layer of material, the at least one layer of material including a layer of conductive metal oxide (CMO) operative to store data as a plurality of resistive states;

a non-ohmic device electrically in series with the memory element; and a first electrode in contact with the CMO and including at least one layer of an electrically conductive material, wherein the at least one layer of the electrically conductive material includes a conductive oxide layer in direct contact with the CMO.

7. A memory cell, comprising:

a memory element including at least one layer of material, the at least one layer of material including a layer of conductive metal oxide (CMO) operative to store data as a plurality of resistive states; and a first electrode in contact with the CMO and including at least one layer of an electrically conductive material, the at least one layer of the electrically conductive material includes a conductive oxide layer in direct contact with the CMO, and the conductive oxide layer comprises a material selected from the group consisting of iridium oxide, ruthenium oxide, lanthanum nickel oxide, strontium ruthenium oxide, strontium titanate, and a doped strontium titanate.

8. The memory cell of claim 7, wherein the doped strontium titanate is doped with a material selected from the group consisting of neodymium, tantalum, lanthanum, and praseodymium.

* * * * *

UNITED STATES PATENT AND TRADEMARK OFFICE
CERTIFICATE OF CORRECTION

| | |
|---|---|
| PATENT NO. | : 7,633,790 B2 |
| APPLICATION NO. | : 12/286723 |
| DATED | : December 15, 2009 |
| INVENTOR(S) | : Darrell Rinerson et al. |

Page 1 of 1

It is certified that error appears in the above-identified patent and that said Letters Patent is hereby corrected as shown below:

1. On the Title Page of the Patent, In INID Code (75) Inventors:, Please Delete the word "Darrel" and Replace with the correctly spelled first name of the inventor "Darrell".

2. In Claim 1, Column 10, Line 66, Please Delete the misspelled word "lever" and Replace with the correctly spelled word "layer".

3. In Claim 1, Column 10, Line 67, Please Delete the misspelled word "lever" and Replace with the correctly spelled word "layer".

4. In Claim 1, Column 11, Line 6, Please correct grammar by Deleting the upper case "I" in the word "Includes" and Replacing It with a lower case "i" so that the word correctly reads as "includes".

Signed and Sealed this

First Day of June, 2010

David J. Kappos
*Director of the United States Patent and Trademark Office*